(12) United States Patent
Fang et al.

(10) Patent No.: US 8,143,661 B2
(45) Date of Patent: Mar. 27, 2012

(54) MEMORY CELL SYSTEM WITH CHARGE TRAP

(75) Inventors: Shenqing Fang, Fremont, CA (US);
Rinji Sugino, San Jose, CA (US);
Jayendra Bhakta, Sunnyvale, CA (US);
Takashi Orimoto, Sunnyvale, CA (US);
Hiroyuki Nansei, Fukushima-ken (JP);
Yukio Hayakawa, Fukushima-ken (JP);
Takayuki Maruyama, Fukushima-ken (JP); Hidehiko Shiraiwa, San Jose, CA (US); Kuo-Tung Chang, Saratoga, CA (US); Lei Xue, Sunnyvale, CA (US);
Meng Ding, Sunnyvale, CA (US); Amol Ramesh Joshi, Sunnyvale, CA (US);
YouSeok Suh, Cupertino, CA (US);
Harpreet Sachar, Milpitas, CA (US)

(73) Assignees: Spansion LLC, Sunnyvale, CA (US);
Advanced Micro Devices, Inc., Sunnyvale, CA (US)

(*) Notice: Subject to any disclaimer, the term of this patent is extended or adjusted under 35 U.S.C. 154(b) by 699 days.

(21) Appl. No.: 11/539,984

(22) Filed: Oct. 10, 2006

(65) Prior Publication Data
US 2008/0083946 A1    Apr. 10, 2008

(51) Int. Cl.
*H01L 29/792* (2006.01)
(52) U.S. Cl. ............... 257/314; 257/324; 257/E29.309; 257/E21.21; 438/216
(58) Field of Classification Search .................. 257/314, 257/315, 324, E21.21, E21.679, E29.309; 438/216
See application file for complete search history.

(56) References Cited

U.S. PATENT DOCUMENTS

| | | | |
|---|---|---|---|
| 6,399,520 B1* | 6/2002 | Kawakami et al. | 438/778 |
| 6,436,768 B1 | 8/2002 | Yang et al. | |
| 6,709,928 B1* | 3/2004 | Jenne et al. | 438/264 |
| 6,804,136 B2* | 10/2004 | Forbes | 365/94 |
| 6,897,149 B2 | 5/2005 | Sugawara et al. | |
| 6,949,789 B2 | 9/2005 | Weimer et al. | |
| 7,042,045 B2 | 5/2006 | Kang et al. | |
| 7,045,854 B2 | 5/2006 | Osabe et al. | |

* cited by examiner

*Primary Examiner* — Tuan N. Quach
(74) *Attorney, Agent, or Firm* — Farjami & Farjami LLP

(57) ABSTRACT

A memory cell system is provided including a first insulator layer over a semiconductor substrate, a charge trap layer over the first insulator layer, and slot where the charge trap layer includes a second insulator layer having the characteristic of being grown.

19 Claims, 4 Drawing Sheets

MEMORY CELL SYSTEM WITH CHARGE TRAP

CROSS-REFERENCE TO RELATED APPLICATIONS

This application contains subject matter related to a co-pending U.S. Patent Application by Meng Ding, Robert B. Ogle, Jr., Chi Chang, Lei Xue, and Mark Randolph entitled "Memory Cell System Using Silicon-Rich Nitride". The related application is assigned to Spansion LLC and Advanced Micro Devices, Inc., having Ser. No. 11/277,008, filed on Mar. 20, 2006.

TECHNICAL FIELD

The present invention relates generally to memory system and more particularly to non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Various types of non-volatile memories have been developed including electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture, which results in undesired disturb by neighboring cells as well as degradation of data retention and endurance.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable.

SONOS Flash memories suffer from poor programming performance. Silicon content in the nitride layer improves the programming and erasing performances but offers poor data retention. Although silicon content plays an important role in charge-trapping efficiency, it does not have same constructive effect on leakage characteristics. The interface between the charge trapping layer with both the top blocking oxide layer and the bottom tunneling oxide layer present both scaling and functional problems despite the silicon content as well as add cost to the manufacturing process.

Thus, a need still remains for a memory cell system providing low cost manufacturing, improved yields, improved programming performance, and improved data retention of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory cell system including forming a first insulator layer over a semiconductor substrate, forming a charge trap layer over the first insulator layer, and slot plain antenna plasma oxidizing the charge trap layer for forming a second insulator layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
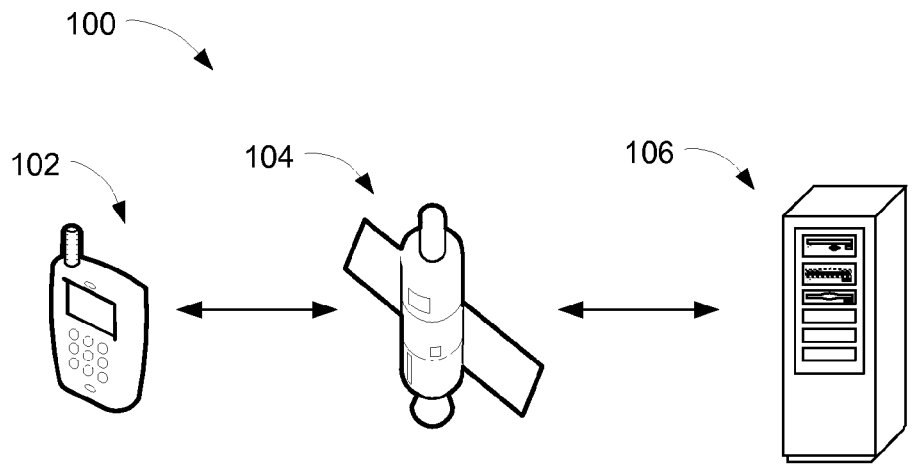
FIG. 1 is schematic views of examples of electronics systems in which various aspects of the present invention may be implemented.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "system" means the method and the apparatus of the present invention. The term "processing" as used herein includes deposition of material, patterning, exposure, development, etching, cleaning, molding, and/or removal of the material or as required in forming a described structure.

Referring now to FIG. 1, therein is shown schematic views of examples of electronics systems 100 in which various aspects of the present invention may be implemented. A smart phone 102, a satellite 104, and a compute system 106 are examples of the electronic systems 100 using the present invention. The electronic systems 100 may be any system that performs any function for the creation, transportation, storage, and consumption of information. For example, the smart phone 102 may create information by transmitting voice to the satellite 104. The satellite 104 is used to transport the information to the compute system 106. The compute system 106 may be used to store the information. The smart phone 102 may also consume information sent from the satellite 104.

Figure 2:
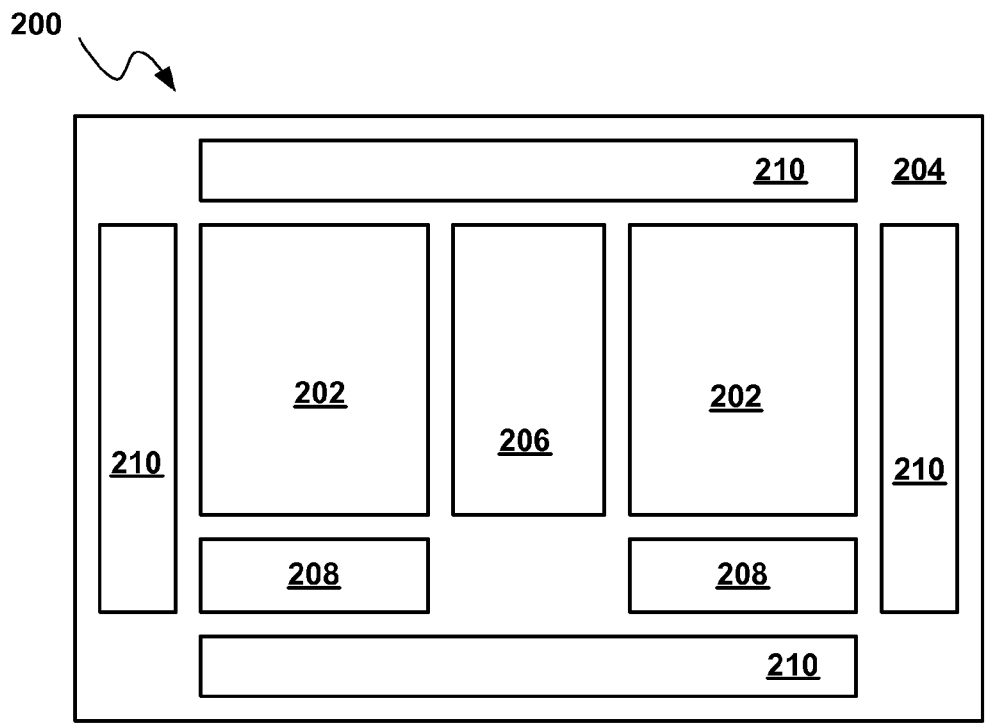
FIG. 2 is a plan view of a device in which various aspects of the present invention may be implemented.

Referring now to FIG. 2, therein is shown a plan view of a device 200 in which various aspects of the present invention may be implemented. The device 200 is a semiconductor device including memory systems 202 having the present invention. The device 200 commonly includes a semiconductor substrate 204 in which one or more high-density core regions and one or more low-density peripheral portions are formed.

High-density core regions typically include one or more of the memory systems 202. Low-density peripheral portions typically include input/output (I/O) circuitry and programming circuitry for individually and selectively addressing a location in each of the memory systems 202. The programming circuitry is represented in part by and includes one or more x-decoders 206 and y-decoders 208, cooperating with I/O circuitry 210 for connecting the source, gate, and drain of selected addressed memory cells to predetermined voltages or impedances to effect designated operations on the memory cell, e.g., programming, reading, and erasing, and deriving necessary voltages to effect such operations.

For illustrative purposes, the device 200 is shown as a memory device, although it is understood that the device 200 may other semiconductor devices having other functional blocks, such as a digital logic block, a processor, or other types of memories. Also for illustrative purposes, the device 200 is described as a single type of semiconductor device, although it is understood that the device 200 may be a multichip module utilizing the present invention with other types of devices of similar or different semiconductor technologies, such as power devices or microelectromechanical systems (MEMS). Further for illustrative purposes, the device 200 is described as a semiconductor device, although it is understood that the device 200 may be a board level product including the present invention.

Figure 3:
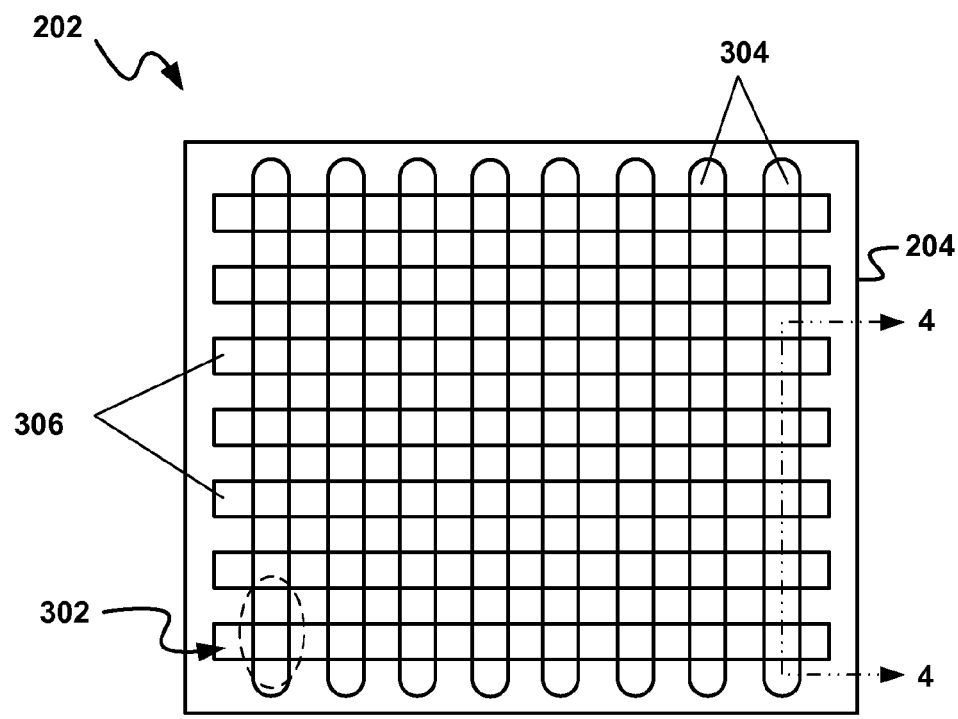
FIG. 3 is a plan view of a portion of the memory systems in which various aspects of the present invention may be implemented.

Referring now to FIG. 3, therein is shown a plan view of a portion of the memory systems 202 in which various aspects of the present invention may be implemented. The memory systems 202 have M×N arrays of a memory cell system 302. The semiconductor substrate 204 has a plurality of bit lines 304 extending in parallel with a plurality of word lines 306 extending in parallel and at right angles to the plurality of the bit lines 304. The word lines 306 and the bit lines 304 have contacts and interconnections (not shown) to the programming circuitry discussed in FIG. 2.

Figure 4:
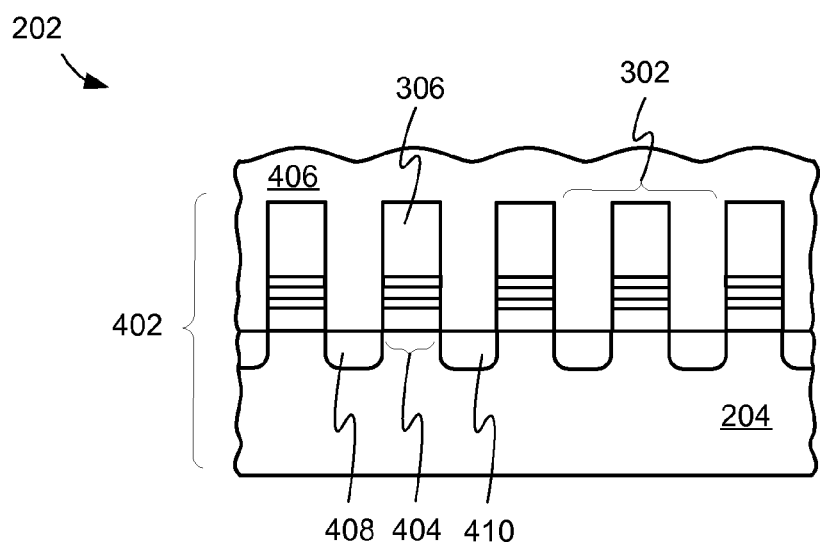
FIG. 4 is a cross-sectional view of a portion of the memory systems along segment 4-4 of FIG. 3.

Referring now to FIG. 4, therein is shown a cross-sectional view of a portion of the memory systems 202 along segment 4-4 of FIG. 3. The cross-sectional view depicts a number of the memory cell system 302 that are adjacent to one another. The cross-sectional view depicts a memory cell stack 402 including a charge storage region 404 for storing an electrical charge, such as electrons. An insulator 406, such as an oxide, cover the semiconductor substrate 204 and surrounds the memory cell system 302.

For illustrative purposes, each of the memory cell stack 402 is shown having one of the charge storage region 404 for storing electrical charges, although it is understood that any number of the charge storage regions may be provided. It is also understood that the charge storage region 404 may provide storage for any number of electrical charges.

The memory cell stack 402 also includes the semiconductor substrate 204, such as a p-type substrate, having a first region 408, such as an n-type region, and a second region 410, such as an n-type region. The first region 408 may be a source and the second region 410 may be the drain or vice versa. Depending on the overall memory array connection, the first region 408, the second region 410, or both may connect to the bit lines 304 of FIG. 3 providing access to the memory cell system 302 for decoding processes, such as reading, programming and erasing.

The memory cell stack 402 also includes the word lines 306, such as polysilicon, n-type polysilicon, p-type polysilicon, or metal, acting as control gates in cooperation with the bit lines 304 for the decoding processes, such as reading, programming and erasing. Depending upon a signal on the word lines 306 and the connection of the bit lines 304 to an electrical source or drain, the memory row 400 may read, program or erase the charge storage region 404.

Figure 5:
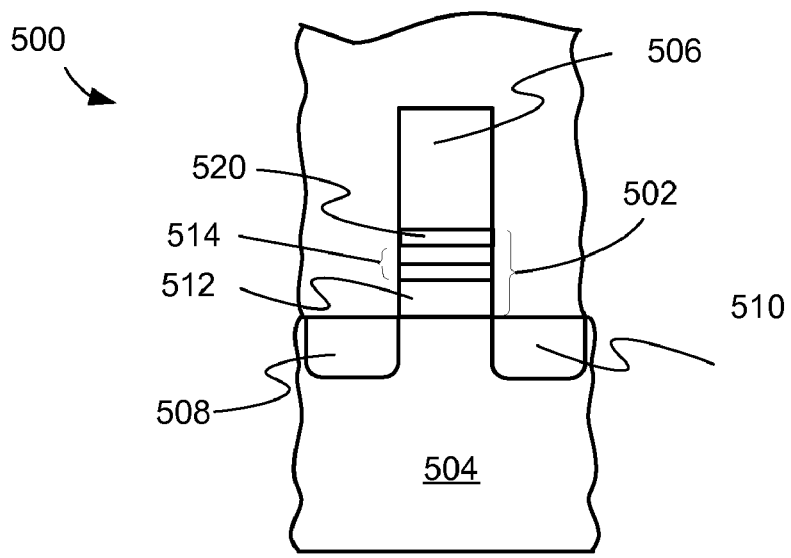
FIG. 5 is a more detailed cross-sectional view of a memory cell stack in an embodiment of the present invention.

Referring now to FIG. 5, therein is shown a cross-sectional view of a memory cell stack 500 in an embodiment of the present invention. The memory cell stack 500 may represent the memory cell stack 402 of FIG. 4. The memory cell stack 500 includes a charge-storage stack 502 on a semiconductor substrate 504, such as a p-type silicon substrate. A semiconductor gate 506, such as a conductive gate electrode comprised of polysilicon, n-type polysilicon, p-type polysilicon, or metal, is on the charge-storage stack 502. A gate contact (not shown), such as an external gate contact, is over the semiconductor gate 506 for external connection.

The charge-storage stack 502 provides a region between a first region 508, such as an n-type region, and a second region 510, such as an n-type region, for storage of electrical charges. The semiconductor substrate 504 and the semiconductor gate 506 provide access for reading and erasing storage locations of the electrical charges.

The charge-storage stack 502 has multiple layers. A first insulator layer 512, such as a bottom tunneling oxide layer of silicon dioxide ($SiO_2$), of the charge-storage stack 502 is over the semiconductor substrate 504. A charge trap layer 514 of the charge-storage stack 502 is over the first insulator layer 512. The charge trap layer 514 provides regions for storage of the electrical charges. The charge trap layer 514 includes a charge trapping material, such as a silicon rich nitride (SRN or SiRN), silicon nitride ($Si_xN_y$), or multiple layers of nitride with different percentages of Si. A second insulator layer 520 is a top blocking oxide layer of silicon dioxide (SiO2) of the charge-storage stack 502 and on the charge trap layer 514.

For illustrative purposes, the charge trap layer 514 is shown as having two layers, although it is understood that the number and types of layers may differ, such as nitride layer on top of SiRN, a layer of SiRN, or a gradient of similar material with different concentrations of silicon or nitrogen from bottom to the top.

For the memory cell stack 500, leakage and charge-trapping efficiency are two major parameters considered in the memory systems 202 of FIG. 2 performance evaluation. Charge-trapping efficiency determines if the memory devices can keep enough charges in the charge trap layer 514 after program/erase operation and is reflected in operation window characteristics.

Figure 6:
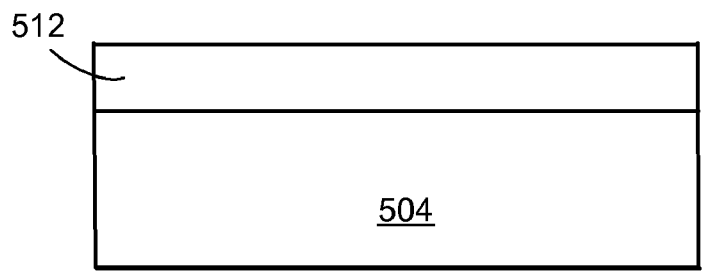
FIG. 6 is a more detailed cross-sectional view of the memory cell stack of FIG. 5 in a formation phase of the first insulator layer.

Referring now to FIG. 6, therein is shown a more detailed cross-sectional view of the memory cell stack 500 of FIG. 5 in a formation phase of the first insulator layer 512. This more detailed cross-sectional view depicts the memory cell stack 500 between the first region 508 of FIG. 5 and the second region 510 of FIG. 5. The first insulator layer 512 is formed over the semiconductor substrate 504. The first insulator layer 512 may be formed by different kinds of process, such as thermal oxidation.

Figure 7:
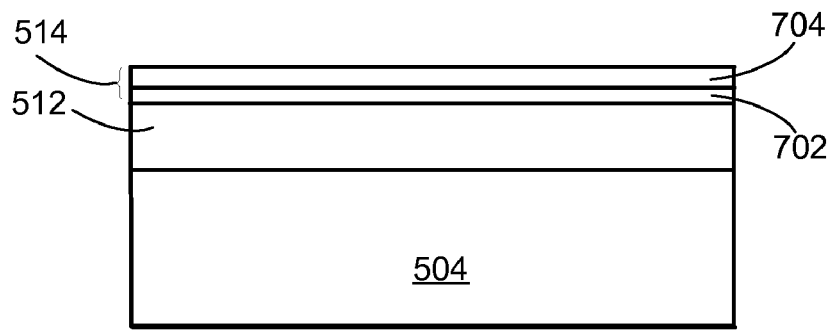
FIG. 7 is a cross-sectional view of the structure of FIG. 6 in a formation phase of the charge trap layer.

Referring now to FIG. 7, therein is shown a cross-sectional view of the structure of FIG. 6 in a formation phase of the charge trap layer 514. The charge trap layer 514 includes a silicon rich nitride layer 702 and an intermediate nitride layer 704. The silicon rich nitride layer 702 provides the primary charge trap region. The intermediate nitride layer 704, such as a nitride layer, a less silicon rich nitride layer, or a regular silicon nitride layer, improves performance of the memory cell stack 500 of FIG. 5 by reducing or eliminating back gate tunneling. The silicon rich nitride layer 702 is deposited on the first insulator layer 512 and over the semiconductor substrate 504. The intermediate nitride layer 704 is formed on the silicon rich nitride layer 702.

The silicon-rich nitride may be formed by a chemical vapor deposition process (CVD) using $NH_3$ and $SiCl_2H_2$ but not limited to the two chemicals. A ratio of the gases, such as $NH_3:SiCl_2H_2$, range from 1:40 to 1:1 can produce silicon-rich nitride with a ratio of Si to N higher than 0.75.

Figure 8:
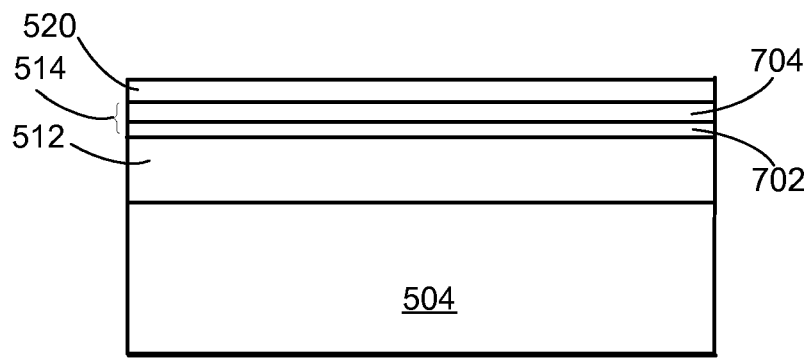
FIG. 8 is a cross-sectional view of the structure of FIG. 7 in a formation phase of the second insulator layer.

Referring now to FIG. 8, therein is shown a cross-sectional view of the structure of FIG. 7 in a formation phase of the second insulator layer 520. A top portion of the charge trap layer 514 undergoes oxidation utilizing a slot plane antenna (SPA) plasma technique to form the second insulator layer 520, as the top blocking oxide layer, from the upper portion of the intermediate layer 704 of the charge trap layer 514. The intermediate layer 704 is partially or completely converted to oxide after SPA oxidation.

The oxidation process with SPA forms a better interface between the second insulator layer 520 and the charge trap layer 514 improving the quality and reliability of the memory cell stack 500 of FIG. 5. The SPA technique produces high-density plasmas at low electron temperatures to enable damage-free processes at temperatures no higher than 800° C. By optimizing the slot configuration of the antenna, the plasma distribution can be adjusted to achieve improved uniformity compared to thermal oxidation processes, such as steam oxidation. As mentioned earlier, the charge trapping efficiency is determined by the silicon content in the charge trap layer 514. Long steam oxidation under high temperature changes the silicon content of the silicon rich nitride layer 702. The low temperature of SPA oxide can preserve the silicon content. High temperature steam oxidation forms rough and non-uniform interface resulting in penetration into the charge trap layer 514 at some weak film spots. SPA oxidation can avoid these problems.

Figure 9:
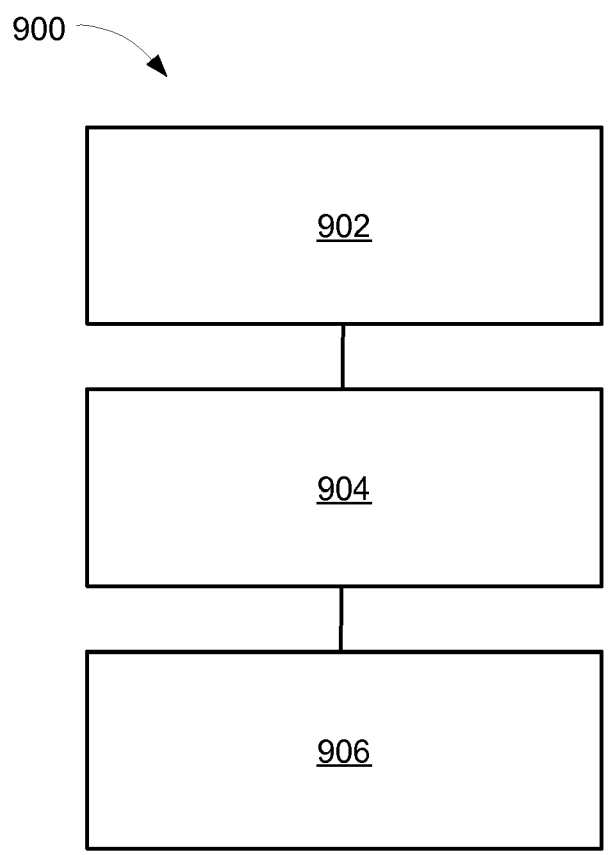
FIG. 9 is a flow chart of a memory cell system for manufacture of the memory cell system in an embodiment of the present invention.

Referring now to FIG. 9, therein is shown a flow chart of a memory cell system 900 for manufacture of the memory cell system 400 in an embodiment of the present invention. The system 900 includes forming a first insulator layer over a semiconductor substrate in a block 902; forming a charge trap layer over the first insulator layer in a block 904; and slot plain antenna plasma oxidizing the charge trap layer for forming a second insulator layer in a block 906.

It has been discovered that the present invention thus has numerous aspects.

It has been discovered that the present invention has improved erase and program performance as well as data retention utilizing the slot plane antenna (SPA) plasma technique to form the second insulator layer, such as a top blocking oxide layer, from the charge trap layer, such as a silicon rich nitride or silicon nitride charge trap layer.

It has been discovered that the SPA growth is superior to thermal oxidation. Thermal oxidation at high temperature consumes silicon in the silicon nitride by converting it to silicon oxide. The high temperature causes the silicon nitride to silicon oxide interface to be rough because of uneven consumption of silicon and the penetration of steam into the silicon nitride layer when used alone as the trapping layer or when used above a silicon rich nitride trapping layer. Thermal oxidation also reduces the silicon in silicon rich nitride when a uniform or gradient silicon rich nitride is used as the trapping layer.

It has also been discovered that the low temperature growth will be more uniform so the silicon nitride to silicon oxide interface to be smoother than the thermal oxide interface.

Further, it has also been discovered that the low temperature reduces oxygen diffusion into the silicon nitride layer to the point that the silicon is not reduced. This result from SPA oxidation of the charge trap layer and the improved uniformity of the interface provide a substantially uniform thickness of the second insulator layer, such as the top blocking oxide layer. The uniformity is a characteristic of the oxide grown by SPA that is not achievable by a thermal oxidation process or a deposition process.

An aspect is that the present invention improves the interface quality between the top blocking oxide layer and the charge trap layer. The SPA technique improves the uniformity of the interface between the layers.

Another aspect of the present invention eliminates high temperature manufacturing steps required by thermal oxidation. These high temperatures in thermal oxidation change silicon content in the charge trap layer and are limiters to scaling and 300 mm wafer manufacturing.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the memory cell system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A memory cell system comprising:
   a first insulator layer over a semiconductor substrate;
   a charge trap layer over the first insulator layer, the charge trap layer including a second insulator layer; and
   a third insulator layer over the second insulator layer, the third insulator layer comprising at least a portion of the second insulator layer converted to oxide wherein an interface between the charge trap layer and the third insulator layer is smoother than a thermal oxide interface.

2. The system as claimed in claim 1 wherein the charge trap layer comprises a nitride.

3. The system as claimed in claim 1 wherein the charge trap layer comprises silicon and nitrogen.

4. The system as claimed in claim 1 wherein the charge trap layer has multiple layers comprised of a silicon rich nitride layer over the first insulator layer and a layer of nitride with less silicon content over the silicon rich nitride layer.

5. The system as claimed in claim 1 further comprising:
   a memory system with memory cell systems; and
   a device or an electronic system with the memory system.

6. The system as claimed in claim 1 wherein:
   the first insulator layer is a tunneling oxide layer over the semiconductor substrate;
   the second insulator layer is a nitride layer over the first insulator layer; and
   the third insulator layer, having substantially uniform thickness, is a blocking oxide layer on the charge trap layer.

7. The system as claimed in claim 6 wherein the tunneling oxide layer is a silicon dioxide layer.

8. The system as claimed in claim 6 wherein the nitride layer over the tunneling oxide layer has silicon and nitrogen.

9. The system as claimed in claim 6 wherein the nitride layer has a gradient concentration of the silicon in the nitride layer.

10. The system as claimed in claim 6 further comprising a conductive gate electrode on the blocking oxide layer.

11. The system as claimed in claim 1 wherein the third insulator layer has been grown from the second insulator layer using a slot plane antenna plasma technique.

12. A memory cell system comprising:
    a tunneling layer over a semiconductor substrate;
    a charge trap layer over the tunneling layer, the charge trap layer including a nitride layer; and
    a blocking layer over the charge trap layer, the blocking layer comprising at least a portion of the nitride layer converted to oxide, wherein an interface between the charge trap layer and the blocking layer is smoother than a thermal oxide interface.

13. The system as claimed in claim 12 wherein the charge trap layer includes a silicon rich nitride layer, the nitride layer being less silicon rich then the silicon rich nitride layer.

14. The system as claimed in claim 12 wherein the charge trap layer has multiple layers comprised of a silicon rich nitride layer over tunneling layer and a layer of nitride with less silicon content over the silicon rich nitride layer.

15. The system as claimed. in claim 12 further comprising:
    a memory system with memory cell systems; and
    a device or an electronic system with the memory system.

16. The system as claimed in claim 12 wherein:
    the tunneling layer is a tunneling oxide layer; and
    the blocking layer is a top blocking oxide layer on the charge trap layer, the blocking layer having a uniform interface with the nitride layer.

17. The system as claimed in claim 16 wherein the tunneling oxide layer is a silicon dioxide layer.

18. The system as claimed in claim 16 wherein the nitride layer has a gradient concentration of the silicon in the nitride layer.

19. The system as claimed in claim 12 wherein the blocking layer has been grown from the nitride layer using a slot plane antenna plasma technique.

* * * * *